(12) United States Patent
Yu et al.

(10) Patent No.: US 8,508,030 B2
(45) Date of Patent: Aug. 13, 2013

(54) LED MODULE

(75) Inventors: Tai-Cherng Yu, Taipei Hsien (TW);
Chun-Yu Lin, Taipei Hsien (TW)

(73) Assignee: Hon Hai Precision Industry Co., Ltd.,
New Taipei (TW)

( * ) Notice: Subject to any disclaimer, the term of this patent is extended or adjusted under 35 U.S.C. 154(b) by 373 days.

(21) Appl. No.: 12/842,018

(22) Filed: Jul. 22, 2010

(65) Prior Publication Data

US 2011/0156082 A1    Jun. 30, 2011

(30) Foreign Application Priority Data

Dec. 30, 2009  (TW) .............................. 98145720 A

(51) Int. Cl.
*H01L 23/22* (2006.01)
(52) U.S. Cl.
USPC ............ 257/687; 257/706; 257/714; 257/722
(58) Field of Classification Search
USPC ............ 257/79, 88, 687, 706, 711, 712, 714, 257/719–722, E23.101
See application file for complete search history.

(56) References Cited

U.S. PATENT DOCUMENTS

2011/0122630 A1*  5/2011  Tan et al. ...................... 362/294

FOREIGN PATENT DOCUMENTS

CN          101608747 A       12/2009

* cited by examiner

*Primary Examiner* — Jack Chen
(74) *Attorney, Agent, or Firm* — Altis Law Group, Inc.

(57) ABSTRACT

An exemplary LED module includes a ceramic substrate, a heat spreader, a heat sink, an LED die, and a packaging layer. The substrate defines a hole extending therethrough from a top side to a bottom side thereof. The heat spreader is disposed in the hole with a top side thereof substantially coplanar with the top side of the substrate. An outer circumferential surface of the heat spreader contacts an inner circumferential surface of the substrate around the hole. The heat sink is attached to the top sides of the substrate and the heat spreader. The LED die is attached to a bottom side of the heat spreader, and the packaging layer encapsulates the LED die.

9 Claims, 1 Drawing Sheet

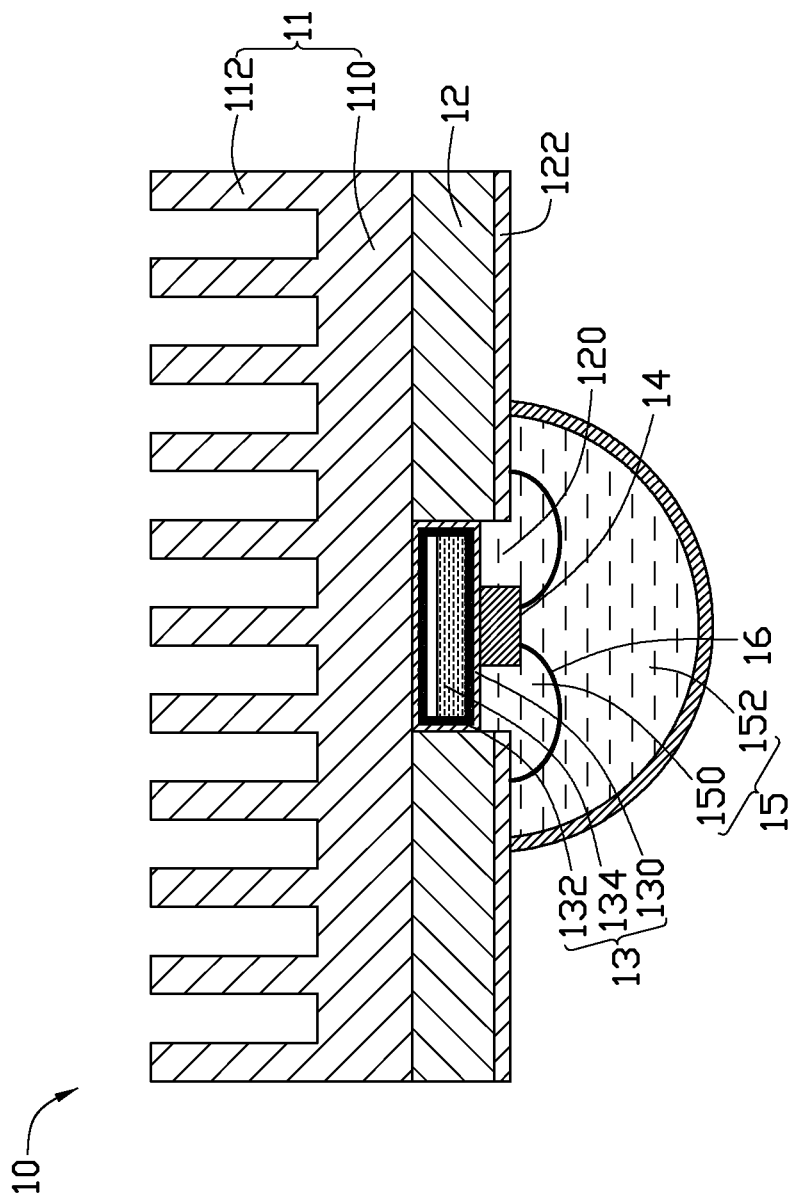

LED MODULE

BACKGROUND

1. Technical Field

The present disclosure relates to light emitting diode (LED) modules, and particularly to an LED module having improved heat dissipation ability.

2. Description of Related Art

In recent years, due to their excellent light quality and high luminous efficiency, light emitting diodes (LEDs) have been increasingly applied to substitute for cold cathode fluorescent lamps (CCFL), incandescent bulbs, compact fluorescent bulbs and fluorescent tubes as light source of an illumination device.

Generally, an LED lamp includes an LED mounted on and electronically connected with a printed circuit board (PCB). A heat sink made of metal, such as aluminum or copper, is usually attached to the PCB to remove the heat generated by the LED. However, the PCB is usually made of FR-4, which is produced by glass fiber impregnation into ethoxyline, and has a very large thermal resistance. The heat generated by the LED thus cannot be rapidly and efficiently transferred from the LED to the heat sink via the PCB, which results in significant reductions in the lifespan of the LED.

What is needed, therefore, is an LED module which can overcome the limitations described.

BRIEF DESCRIPTION OF THE DRAWING

The only drawing is a schematic view of an LED module in accordance with an exemplary embodiment of the disclosure.

DETAILED DESCRIPTION

Referring to the only drawing, an LED module 10 in accordance with an exemplary embodiment of the disclosure is shown. The LED module 10 includes a heat sink 11, a substrate 12, a heat spreader 13, an LED die 14, and a packaging layer 15.

The heat sink 11 is made of highly thermally conductive material, such as copper, aluminum, or their alloys. The heat sink 11 includes a base 110 and a plurality of fins 112 integrally extending up from the base 110 for increasing the heat dissipation area of the heat sink 11. In this embodiment, the heat sink 11 is an extruded aluminum heat sink, and the fins 112 are integrally formed with the base 110 as a monolithic piece. Alternatively, the fins 112 and the base 110 can be formed separately, and then connected together by soldering.

The substrate 12 is made of ceramics, such as aluminum oxide ceramics, aluminum nitride ceramics, with a layer of circuits 122 formed at a bottom side thereof. A hole 120 is defined in a central portion of the substrate 12. In this embodiment, the hole 120 is circular, and extends through the substrate 12 along a thickness direction of the substrate 12.

The heat spreader 13 is disposed in the hole 120 of the substrate 12. The heat spreader 13 includes a hollow chamber 130, a layer of wick structure 132 formed on an inner surface of the chamber 130, and working fluid 134 received in the chamber 130. The wick structure 132 spreads the entire inner surface of the chamber 130. In this embodiment, a profile of the chamber 130 of the heat spreader 13 is column-shaped, and flat. An outer diameter of the chamber 130 is substantially equal to a diameter of the hole 120 of the substrate 12, and thus an outer circumferential surface of the heat spreader 13 contacts an inner circumferential surface of the substrate 12 around the hole 120 closely.

A height of the chamber 130 is less than a depth of the circular hole 120, i.e., less than a thickness of the substrate 12. A top side of the chamber 130 of the heat spreader 13 is arranged coplanar with a top side of the substrate 12. Both the top sides of the chamber 130 and the substrate 12 contact the base 110 of the heat sink 11 closely. A layer of thermal grease (not shown) can be applied between the base 110 of the heat sink 11 and the chamber 130, and between the base 110 and the substrate 12 to enhance heat conduction therebetween. A bottom side of the chamber 130 of the heat spreader 13 is higher than a bottom side of the substrate 12, and a lower portion of the hole 120 under the heat spreader 13 forms a receiving space (not labeled) for accommodating the LED die 14 therein.

The LED die 14 is disposed in the receiving space, and contacts the bottom side of the heat spreader 13 closely. In this embodiment, only one LED die 14 is shown. Alternatively, there can be a plurality of LED dies 14. The LED die 14 is electrically connected with the circuits 122 of the substrate 12 through wire bonding, in which a pair of gold threads 16 are provided to connect the LED die 14 to the circuits 122 of the substrate 12.

The packaging layer 15 encapsulates the LED die 14 to firmly secure the LED die 14 in place. The packaging layer 15 is generally made of polymeric material such as resin, and is transparent for light transmitting therethrough. The packaging layer 15 includes an upper portion 150 filled in the receiving space and a lower portion 152 protruding out of the substrate 12. The lower portion 152 of the packaging layer 15 is substantially semi-sphere with a diameter larger than that of the circular hole 120. A periphery of the lower portion 152 of the packaging layer 15 connects the substrate 12 at a periphery of the hole 120. Thus the LED die 14, the heat spreader 13 and the substrate 12 are integrally connected by the packaging layer 15.

When the LED die 14 is activated by an electric energy, heat is also generated. Since the LED die 14 contacts the heat spreader 13 directly, the working fluid 134 in the heat spreader 13 absorbs the heat of the LED die 14 quickly and thus evaporates. Then the vapor moves up to dissipate a majority of the heat to the top side of the chamber 130, whereby the vapor is cooled and condensed thereat. The condensed working fluid 134 returns back along the wick structure 132 to continuously transfer heat to the top side of the heat spreader 13. The heat at the top side of the heat spreader 13 is finally dissipated to ambient air by the fins 112 of the heat sink 11.

In addition, a minority of the heat is transferred to the substrate 12 via the outer circumferential surface of the heat spreader 13. The heat transferred to the substrate 12 can be either dissipated to the ambient air directly, or be further transferred to the heat sink for dissipation. Since the substrate 12 is made of ceramics, which has a relatively larger heat conductive coefficient, the heat transferred thereto can be dissipated efficiently. Furthermore, a thermal expansion coefficient of the substrate 12 made of ceramics is similar to that of the LED die 14; thus, a stability and sturdiness of the LED module 10 is enhanced.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED module, comprising:
a ceramic substrate forming a layer of circuits, the substrate defining a hole therein;
a heat spreader disposed in the hole of the substrate and contacting the substrate, the heat spreader comprising a chamber and working fluid received in the chamber;
an LED die attached to the chamber of the heat spreader and electrically connected to the circuits of the substrate; and
a packaging layer encapsulating the LED die, and connecting the LED die, the heat spreader and the substrate integrally.

2. The LED module of claim 1, wherein the substrate is aluminum oxide ceramics.

3. The LED module of claim 1, wherein the substrate is aluminum nitride ceramics.

4. The LED module of claim 1, wherein the hole extends through the substrate.

5. The LED module of claim 4, wherein a top side of the heat spreader is coplanar with a top side of the substrate.

6. The LED module of claim 5, wherein the circuit is formed at a bottom side of the substrate, and the LED die is attached to a bottom side of the chamber of the heat spreader closely.

7. The LED module of claim 6, wherein a thickness of the heat spreader is less than a thickness of the substrate, a lower portion of the hole under the heat spreader forms a receiving space accommodating the LED die therein.

8. The LED module of claim 7, wherein the packaging layer comprises an upper portion filled in the receiving space and a lower portion protruding out of the substrate, a diameter of the lower portion being larger than that of the hole, the lower portion of the packaging layer connecting the substrate at a periphery of the hole.

9. The LED module of claim 5, further comprising a heat sink attached to the top sides of the heat spreader and the substrate.

* * * * *